United States Patent
Wang et al.

(10) Patent No.: US 7,986,498 B2
(45) Date of Patent: Jul. 26, 2011

(54) TMR DEVICE WITH SURFACTANT LAYER ON TOP OF COFE$_x$B$_y$/COFE$_z$ INNER PINNED LAYER

(75) Inventors: Hui-Chuan Wang, Pleasanton, CA (US); Tong Zhao, Fremont, CA (US); Min Li, Dublin, CA (US); Kunliang Zhang, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 370 days.

(21) Appl. No.: 12/321,901

(22) Filed: Jan. 27, 2009

(65) Prior Publication Data
US 2009/0161266 A1    Jun. 25, 2009

Related U.S. Application Data

(62) Division of application No. 11/181,176, filed on Jul. 14, 2005, now Pat. No. 7,497,007.

(51) Int. Cl.
*G11B 5/127* (2006.01)
(52) U.S. Cl. .................................... 360/324.2
(58) Field of Classification Search .............. 360/324.2
See application file for complete search history.

(56) References Cited

U.S. PATENT DOCUMENTS

| | | | |
|---|---|---|---|
| 6,479,096 B1 | 11/2002 | Shi et al. | |
| 6,631,055 B2 | 10/2003 | Childress et al. | |
| 6,831,312 B2 | 12/2004 | Slaughter et al. | |
| 6,870,718 B2 | 3/2005 | Takahashi et al. | |
| 7,423,848 B2 * | 9/2008 | Horng et al. | 360/324.1 |
| 7,564,658 B2 * | 7/2009 | Zhang et al. | 360/324.11 |
| 2003/0128481 A1 | 7/2003 | Seyama et al. | |
| 2005/0170532 A1 * | 8/2005 | Horng et al. | 438/3 |
| 2005/0201022 A1 | 9/2005 | Horng et al. | |
| 2005/0226052 A1 | 10/2005 | Horng et al. | |
| 2005/0254293 A1 | 11/2005 | Horng et al. | |
| 2007/0268633 A1 * | 11/2007 | Horng et al. | 360/324.12 |

* cited by examiner

*Primary Examiner* — Mark Blouin
(74) *Attorney, Agent, or Firm* — Saile Ackerman LLC; Stephen B. Ackerman

(57) ABSTRACT

A high performance TMR element is fabricated by inserting an oxygen surfactant layer (OSL) between a pinned layer and AlOx tunnel barrier layer in a bottom spin valve configuration. The pinned layer preferably has a SyAP configuration with an outer pinned layer, a Ru coupling layer, and an inner pinned layer comprised of CoFe$_x$B$_y$/CoFe$_z$ wherein x=0 to 70 atomic %, y=0 to 30 atomic %, and z=0 to 100 atomic %. The OSL is formed by treating the CoFe$_z$ layer with oxygen plasma. The AlOx tunnel barrier has improved uniformity of about 2% across a 6 inch wafer and can be formed from an Al layer as thin as 5 Angstroms. As a result, the Hin value can be decreased by ⅓ to about 32 Oe. A dR/R of 25% and a RA of 3 ohm-cm$^2$ have been achieved for TMR read head applications.

19 Claims, 3 Drawing Sheets

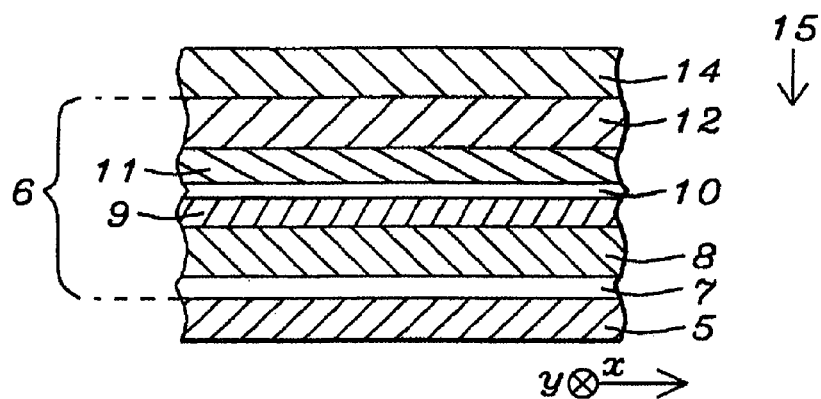
FIG. 1 - Prior Art
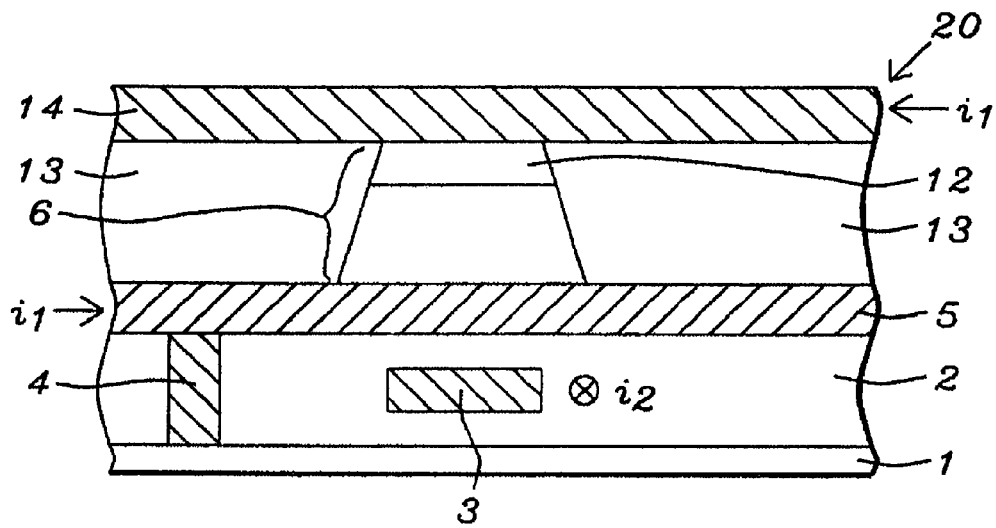
FIG. 2 - Prior Art
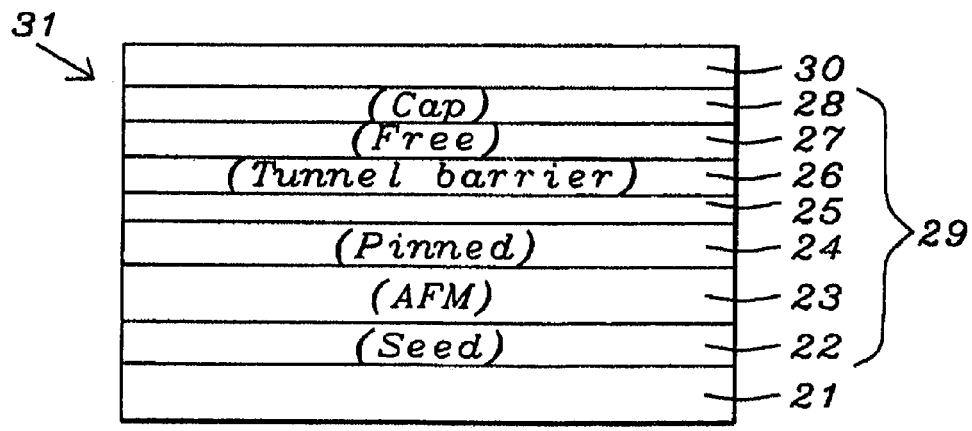
FIG. 3

TMR DEVICE WITH SURFACTANT LAYER ON TOP OF COFE$_x$B$_y$/COFE$_z$ INNER PINNED LAYER

This is a Divisional application of U.S. patent application Ser. No. 11/181,176, filed on Jul. 14, 2005 now U.S. Pat. No. 7,497,007, which is herein incorporated by reference in its entirety, and assigned to a common assignee.

RELATED PATENT APPLICATIONS

This application is related to the following: Ser. No. 10/796,387, filing date Mar. 9, 2004; Ser. No. 10/844,171, filing date May 12, 2004; Ser. No. 10/768,917, filing date Jan. 30, 2004; and Ser. No. 10/820,391, filing date Apr. 8, 2004; all assigned to a common assignee.

FIELD OF THE INVENTION

The invention relates to a high performance tunneling magnetoresistive (TMR) element and a method for making the same, and in particular, to a method of treating an inner pinned layer in a TMR stack to form an oxygen surfactant layer that improves the TMR ratio and tunnel barrier uniformity while achieving the desired RA range.

BACKGROUND OF THE INVENTION

A TMR element is used in magnetic devices such as a Magnetic Random Access Memory (MRAM) structure and a magnetic read head. In FIG. 1, a TMR element 6 is shown wherein a stack of layers has a configuration in which two ferromagnetic layers are separated by a thin non-magnetic dielectric layer. In an MRAM structure, the TMR element is commonly referred to as a magnetic tunnel junction (MTJ) and is formed between a bottom electrode 5 or bottom conductor and a top electrode 14 also known as a top conductor. The bottom conductor 5 typically has a seed layer/Cu/capping layer configuration and is used to connect the TMR element 6 to an underlying transistor (not shown). In a magnetic read head, the TMR element 6 is formed between a bottom shield and a top shield (not shown). The bottom (seed) layer 7 in the TMR element 6 is generally comprised of one or more seed layers that promote a smooth and dense crystal growth in overlying layers. Above the seed layer 7 is an anti-ferromagnetic (AFM) pinning layer 8 and a first ferromagnetic layer that is a "pinned" layer 9 on the AFM layer. The thin tunnel barrier layer 10 above the pinned layer 9 is generally comprised of a dielectric material such as AlOx that may be formed by first depositing an Al layer and then performing an in-situ oxidation. The tunnel barrier layer 10 must be extremely uniform over the wafer since small AlOx thickness variations result in large variations in resistance. A more uniform tunnel barrier is required for advanced TMR designs which means the underlying layers should have improved thickness uniformity. A ferromagnetic "free" layer 11 is formed on the tunnel barrier layer 10 and is typically less than 50 Angstroms thick to obtain low switching fields in the patterned bits. At the top of the TMR element is a cap layer 12.

The MTJ stack in FIG. 1 has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a cap layer.

The pinned layer 9 has a magnetic moment that is fixed in the y direction by exchange coupling with the adjacent AFM layer 8 that is also magnetized in the y direction. The free layer 11 has a magnetic moment that is either parallel or anti-parallel to the magnetic moment in the pinned layer. The tunnel barrier layer 10 is so thin that a current through it can be established by quantum mechanical tunneling of conduction electrons. The magnetic moment of the free layer may switch in response to external magnetic fields generated by passing a current through the bottom conductor 5 and top conductor 14. It is the relative orientation of the magnetic moments between the free and pinned layers that determines the tunneling current and therefore the resistance of the tunneling junction. When a sense current 15 is passed from the top conductor 14 to the bottom conductor 5 (or top shield to bottom shield in a read head) in a direction perpendicular to the TMR layers, a lower resistance is detected when the magnetization directions of the free and pinned layers are in a parallel state ("1" memory state) and a higher resistance is noted when they are in an anti-parallel state or "0" memory state.

Referring to FIG. 2, the TMR (MTJ) element 6 is shown interposed between the bottom conductor 5 and a top conductor 14 in a MRAM structure 20. The substrate 1 is comprised of a transistor (not shown) that is typically connected to the bottom conductor by a stud 4. A digit line 3 (word line in a 1T1MTJ) is formed below the MTJ element 6 and within a first insulation layer 2 that is usually a composite layer consisting of a stack of two or more dielectric layers which are not shown in order to simplify the drawing. The MTJ element 6 contacts the top conductor 14 (bit line) through the capping layer 12 and is formed in a second insulation layer 13 that is disposed on the bottom conductor 5. From a top-down perspective (not shown), a plurality of MTJ elements is formed in an array between multiple rows of bottom conductors (word lines) and multiple columns of top conductors (bit lines). Each MRAM cell has its own bottom conductor.

Switching of the free layer magnetization in the MTJ bit is accomplished by applying currents in orthogonal directions. For instance, the MTJ element may be elliptical in shape from a top-down view with a long axis running parallel to the underlying digit or word line 3. Currents $i_1$ running transversely in the bit line 14 and bottom conductor 5 are orthogonal to the current $i_2$ in the digit line (MTJ) or word line 3 (1T1MTJ). Thus, the current $i_1$ provides the field parallel to the easy axis of the bit while the current $i_2$ provides the perpendicular (hard axis) component of the field. The intersection of the conductive lines generates a peak field that is engineered to be just over the switching threshold of the MTJ.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In cross-point MRAM architecture, the top conductor or the bottom conductor participates in both read and write operations.

In addition to MRAM applications, a TMR element with a thinner tunnel barrier layer and a very low resistance×area (RA) value may be employed as a tunneling magnetoresistive (TMR) sensor between a bottom shield and top shield in a magnetic read head. A TMR sensor typically has a cross-sectional area of about 0.1 micron×0.1 micron at the air bearing surface (ABS) plane of the read head.

A high performance TMR element is characterized by a high TMR ratio which is dR/R where R is the minimum resistance of the TMR element and dR is the change in resistance observed by changing the magnetic state of the free layer. A higher dR/R improves the readout speed in an MRAM array. In order to achieve good tunnel barrier properties such as a specific junction resistance×area (RA) value and a high breakdown voltage (Vb), it is necessary to have a uniform tunnel barrier layer that is promoted by a smooth and flat underlying layers. For advanced TMR read head technology applications, a dR/R value above 20% and a RA value that is preferably below 10 ohm/μm$^2$ are needed.

The performance of an MTJ element is enhanced according to U.S. Pat. No. 6,831,312 by incorporating an amorphous alloy such as CoFeB as the pinned layer and free layer in an MTJ stack. Boron is included in the alloy to control the recrystallization temperature and polarization of the resulting MTJ device.

In U.S. Pat. No. 6,479,096, a Pb surfactant layer is included in the deposition of a non-magnetic Cu spacer layer and promotes a face centered cubic Cu layer that is grown layer by layer to form a smooth surface. As a result, there is an improved interface between the Cu and adjacent layers that enhances sensor performance and reliability.

An oxide layer is formed as a magnetic domain control layer adjacent to a magneto-resistive sensor in U.S. Pat. No. 6,870,718. There may also be an oxide underlayer material between the magnetic domain control layer and sensor to prevent shunting from the magnetoresistive sensor to the magnetic domain control layer.

In U.S. Pat. No. 6,631,055, a flux guided MTJ is described wherein a pinned layer is comprised of an active and inactive region. The inactive region may be oxidized to reduce its electrical conductivity and lower the magnetic moment to near zero.

A CoFeB layer interposed between Cu layers in a CPP GMR spin valve is oxidized to provide an insulating barrier between the Cu layers in U.S. Patent Application 2003/0128481. The insulating barrier is a metal oxide with an undefined thickness.

SUMMARY OF THE INVENTION

One objective of the present invention is to provide a TMR element that has a surfactant layer formed on a pinned layer to promote a smoother overlying tunnel barrier layer and free layer and thereby achieve a dR/R of at least 20% and a RA value below 10 ohm/μm$^2$ for a certain sensor size in a read head and achieve a higher performance as an MTJ element in MRAM applications.

A second objective of the present invention is to provide a TMR element according to the first objective wherein the tunnel barrier layer can be thinned to 5 Angstroms for read head applications and maintain good uniformity of about 2% (three sigma) across a six inch wafer.

A further objective of the present invention is to provide a method of forming a TMR element that satisfies the first and second objectives.

According to a first embodiment, these objectives are achieved by forming a TMR element on a suitable substrate such as a bottom shield. In one aspect, the TMR element has a bottom spin valve configuration in which a seed layer, AFM layer, and pinned layer are formed sequentially on the bottom shield. Furthermore, the bottom shield may have an amorphous Ta capping layer formed thereon with the TMR sensor disposed on the Ta layer. The pinned layer preferably has an AP2/Ru/AP1 configuration in which the Ru layer couples an outer (AP2) layer on the AFM layer to an inner (AP1) layer. Moreover, the inner (AP1) layer is preferably a composite having an upper CoFe$_Z$ layer on a lower CoFe$_X$B$_Y$ layer wherein x is 0 to 70 atomic %, y is 0 to 30 atomic %, and z is 0 to 100 atomic % since this composite AP1 layer has a smoother surface than a conventional CoFe AP1 layer.

A key feature is that an oxygen containing surfactant layer (OSL) is formed on the inner pinned layer in the TMR element to improve film uniformity in overlying layers, and particularly for the tunnel barrier layer which is made of AlOx or another metal oxide and is disposed on the OSL. Above the tunnel barrier layer is formed a free layer and then a cap layer as the uppermost layer in the TMR element.

Typically, a TMR stack of layers is laid down in a sputtering system. The seed layer, AFM layer, and pinned layer may be deposited in the same sputter chamber. In one embodiment, an OSL less than about 1 atomic layer thick is formed by treating a CoFe$_X$B$_Y$/CoFe$_Z$ composite inner (AP1) pinned layer with oxygen plasma for a certain time. The composite CoFe$_X$B$_Y$/CoFe$_Z$ AP1 layer may be formed on a Ru layer that is disposed on a CoFe outer pinned layer. The OSL on the upper CoFe$_Z$ layer serves to promote a smooth Al layer that is subsequently deposited on the OSL and results in a thin AlOx interface between the CoFe$_Z$ layer and the Al layer. Thereafter, the remaining Al layer is oxidized in an oxidation chamber to yield an AlOx tunnel barrier layer. The free layer and cap layer are then sequentially deposited on the AlOx tunnel barrier layer in a sputter chamber to complete the TMR stack. The TMR stack is patterned by a conventional method prior to forming a top shield on the cap layer.

In a second embodiment, the TMR stack described previously is formed between a bottom conductor and a top conductor in an MRAM structure. A substrate below the bottom conductor is typically comprised of an isolation transistor and a stud connected thereto which are formed in one or more insulation layers. A patterned bottom conductor with a seed layer/conductor/capping layer configuration is formed on the surface of the substrate and is in electrical contact with the stud and isolation transistor. In MRAM architecture, the bottom conductor is used to connect the isolation transistor to a subsequently formed MTJ. The initially deposited Al layer and subsequent AlOx tunnel barrier thickness in the MTJ are generally thicker compared to the first embodiment to adjust the resulting RA value for MRAM requirements.

BRIEF DESCRIPTION OF THE DRAWINGS

FIG. 1 is a cross-sectional view showing a conventional MTJ element which is formed between a bottom conductor and a top conductor in an MRAM structure.

FIG. 2 is a cross-sectional view of a prior art 1T1MTJ MRAM structure in which a MTJ is formed between a bottom conductor and an overlying bit line (top conductor) while a word line is located in an insulation layer below the bottom conductor.

FIG. 3 is a cross-sectional view depicting a TMR element having a surfactant layer formed between a pinned layer and tunnel barrier layer according to one embodiment of the present invention.

DETAILED DESCRIPTION OF THE INVENTION

Figure 4:
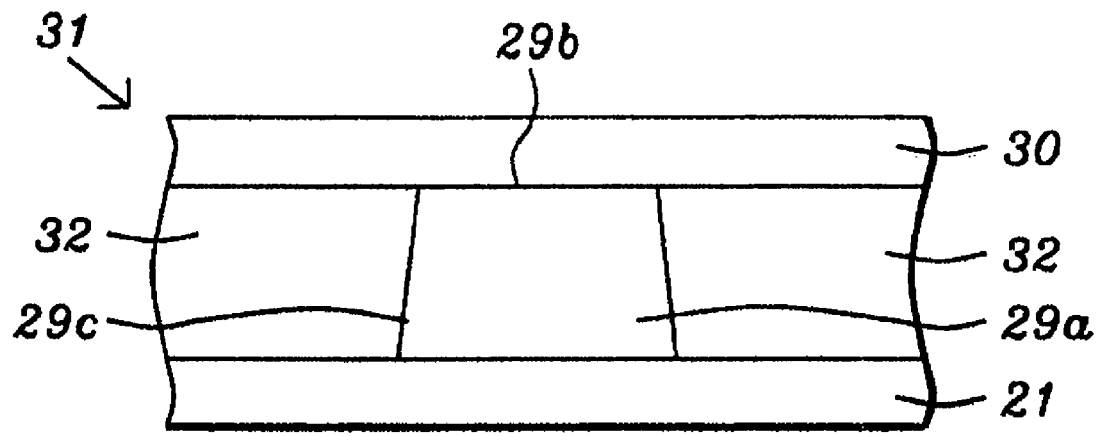
FIG. 4 is a cross-sectional view of the TMR sensor from FIG. 3 interposed between a bottom shield and top shield according to one embodiment of the present invention.

The present invention is a high performance TMR element having an oxygen surfactant layer formed between a pinned layer and a tunnel barrier layer and a method for making the same. While the exemplary embodiment depicts a TMR element in a read head, the present invention may be employed in other devices based on a tunneling magnetoresistive element such as MRAM structures. The TMR element may have a bottom spin valve or multilayer spin value configuration as appreciated by those skilled in the art. Moreover, the present invention is not limited to the type of MRAM architecture, and may apply to cross-point, 1T1MTJ, or other designs used in the art. The drawings are provided by way of example and are not intended to limit the scope of the invention. For example, the drawings are not necessarily drawn to scale and the relative sizes of various elements may differ compared with those in an actual device.

Referring to FIG. 3, a portion of a TMR read head 31 of the present invention is shown from the plane of an air bearing surface (ABS). There is a substrate 21 that in one embodiment is a bottom lead otherwise known as a bottom shield (S1) which may be a NiFe layer about 2 microns thick that is formed by a conventional method on a substructure (not shown). It should be understood that the substructure is typically comprised of a first gap layer disposed on a wafer made of AlTiC, for example.

A TMR stack 29 is formed on the substrate 21 and in the exemplary embodiment has a bottom spin valve configuration wherein a seed layer 22, AFM layer 23, and a pinned layer 24 are sequentially formed on the substrate as the bottom portion of the TMR stack. The seed layer 22 which has a thickness of about 10 to 100 Angstroms may be made of NiCr, NiFeCr, Ta, Ru, or laminated films thereof and serves to promote a smooth and uniform grain structure in overlying layers. Above the seed layer 22 is an AFM layer 23 having a thickness from 40 to 300 Angstroms that may be comprised of MnPt, IrMn, NiMn, OsMn, RuMn, RhMn, PdMn, RuRhMn, or MnPtPd and which is used to pin the magnetization direction of the overlying pinned layer 24.

The pinned layer 24 may have a synthetic anti-parallel (SyAP) configuration (not shown) represented by AP2/Ru/AP1. The AP2 layer (outer pinned layer) is formed on the AFM layer 23 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAP pinned layer 24 along the easy axis direction of the TMR element to be patterned in a later step. Exchange coupling between the AP2 layer and the AP1 layer is facilitated by a coupling layer that is preferably comprised of Ru with a thickness of from 3 to 9 Angstroms although Rh or Ir may be used instead of Ru. In a preferred embodiment, the AP1 layer (inner pinned layer) is formed on a Ru coupling layer which is 7.5 Angstroms thick and is a composite layer having a lower $CoFe_xB_y$ layer and an upper $CoFe_z$ layer wherein x is from 0 to about 70 atomic %, y is from 0 to about 30 atomic %, and z is from 0 to 100 atomic %. The $CoFe_xB_y$ layer has a thickness from 0 to 50 Angstroms and the $CoFe_z$ layer has a thickness between 0 and 50 Angstroms for a total AP1 layer thickness of about 10 to 100 Angstroms.

The $CoFe_xB_y$ layer is amorphous and is used advantageously to promote a more uniform $CoFe_z$ layer than would result if a $CoFe_z$ layer were deposited directly on a Ru coupling layer. Thus, the inventors have discovered that a composite AP1 layer comprised of a lower $CoFe_xB_y$ layer and an upper $CoFe_z$ layer provides a more uniform pinned layer than previously achieved. This finding is substantiated by a lower Hin interlayer coupling value for a spin valve with an AFM/AP2/Ru/AP1/OSL/AlOx/free/cap configuration where AP1 is comprised of $CoFe_xB_y/CoFe_z$ instead of $CoFe_z$.

Note that "inner pinned layer" is meant to indicate the portion of the pinned layer that is closest to an overlying tunnel barrier layer and "outer pinned layer" is meant to signify the portion of the pinned layer closest to the substrate in the exemplary embodiment that features a bottom spin valve configuration in the TMR element. Within the inner pinned layer, "lower" refers to the layer closer the coupling layer and "upper" refers to the layer closer to the tunnel barrier layer.

A key feature of the present invention is that an oxygen surfactant layer (OSL) 25 that is less than about 1 atomic layer thick is formed on the inner (AP1) portion of the pinned layer 24. It should be noted that the inventors have previously employed an OSL between a free layer and spacer layer of a giant magnetoresistive (GMR) element as disclosed in Headway patent application HT03-009 which is herein incorporated by reference in its entirety. Moreover, the inventors have previously formed an OSL on a pinned layer comprised of CoFe(25%) or CoFe(10%)/NiFe(60%) as disclosed in Headway applications HT03-016 and HT02-032 which are herein incorporated by reference in their entirety. The OSL 25 serves as a source of oxygen during the deposition of a metal layer on the OSL that results in a thin metal oxide interface between the unreacted OSL and metal layer. The remaining metal layer is subsequently converted by an oxidation step to a metal oxide tunnel barrier layer such as AlOx, TiOx, or MgOx that includes the thin metal oxide interface.

In one embodiment, a 4 to 20 Angstrom thick Al layer that is preferably about 5 Angstroms thick is deposited on the OSL 25 as described in a later section. A thin AlOx layer (not shown) is formed at the interface with the pinned layer 24 and acts as an oxygen diffusion barrier to prevent oxygen from reaching the underlying AP1 portion of the pinned layer 24 during the oxidation of the remaining Al layer. Thus, the resulting tunnel barrier layer 26 has essentially a uniform AlOx composition which is close to an $Al_2O_3$ stoichiometry. The inventors have found that the tunnel barrier layer 26 is more uniform than when an AlOx layer is formed directly on the pinned layer 24.

There is a free layer 27 disposed on the tunnel barrier layer 26. A more uniform tunnel barrier layer 26 enables a smoother interface between the free layer 27 and tunnel barrier layer and promotes a higher uniformity in the free layer than has previously been achieved. The free layer 27 has a thickness of about 10 to 100 Angstroms and may be comprised of CoFe, NiFe, CoFeB, or a CoFe/NiFe composite. Optionally, the free layer may have a synthetic anti-parallel (SyAP) configuration as appreciated by those skilled in the art.

The uppermost layer in the TMR element 29 is the cap layer 28 which may be comprised of Ra, Ta, or Zr with 10 and 200 Angstroms. A top lead otherwise known as a top shield (S2) 30 is disposed on the cap layer 28 of the TMR element 29. Similar to the bottom shield 21, the top shield 30 may also be a NiFe layer about 2 microns thick. The read head 31 may be further comprised of a second gap layer (not shown) disposed on the top shield 30.

Figure 6:
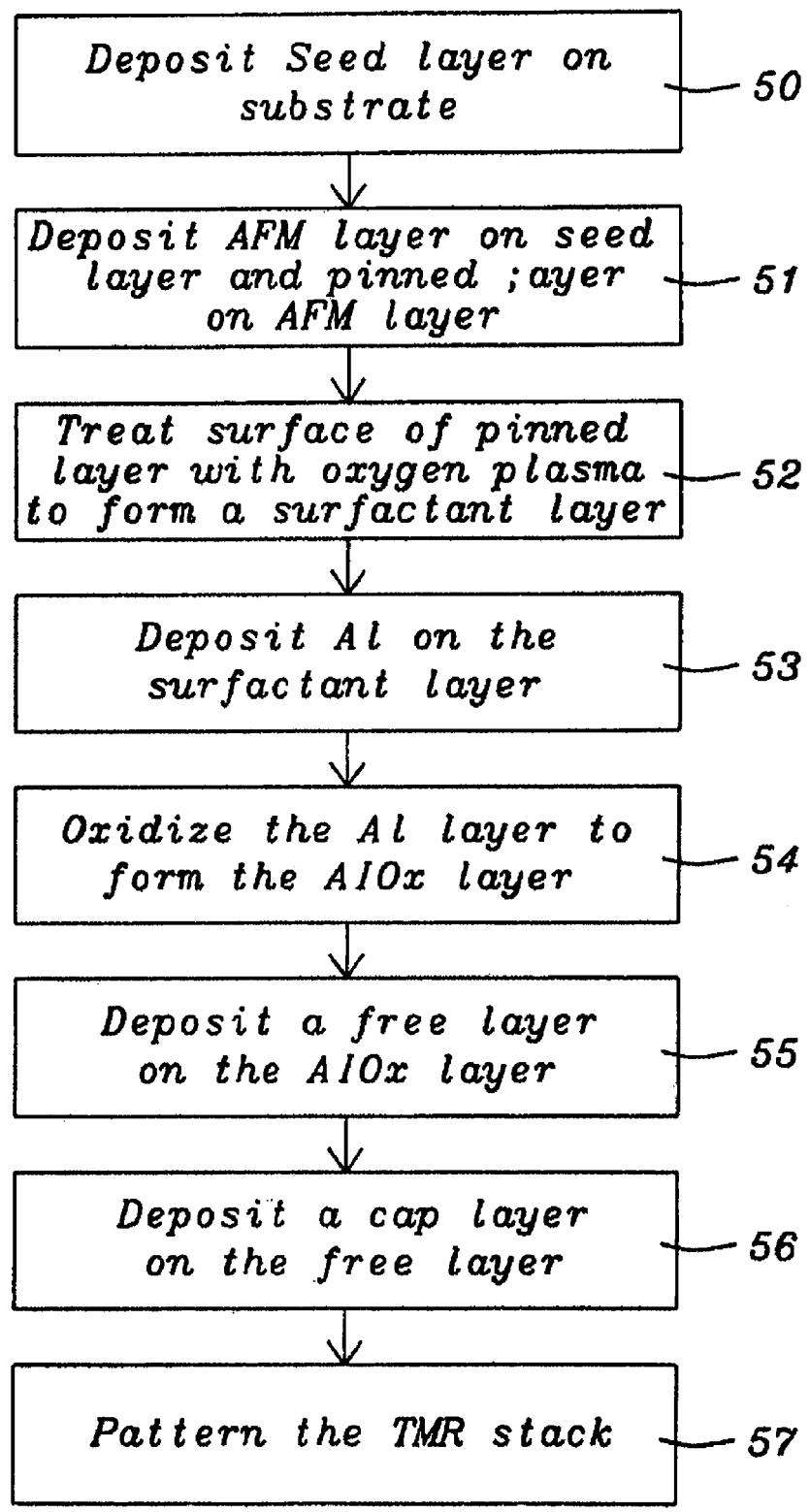
FIG. 6 is a flow diagram that shows a sequence of forming the various layers in a TMR element according to one embodiment of the present invention.

Referring to FIG. 6, a flow diagram is depicted that shows a preferred process sequence of forming a TMR element according to the present invention. In one embodiment, all of the layers in the TMR stack are formed in a sputter deposition tool such as an Anelva C-7100 sputter deposition system which includes ultra high vacuum DC magnetron sputter chambers and oxidation chambers. Typically, the sputter deposition process involves an argon sputter gas and a base pressure between $5 \times 10^{-8}$ and $5 \times 10^{-9}$ torr. Each sputter chamber has multiple targets which are low pressure discharge cathodes. A lower pressure enables more uniform films to be deposited.

A substrate is provided that in one aspect is a previously described bottom shield 21. In step 50, the seed layer 22 is deposited on the bottom shield 21 in a first sputter chamber. Thereafter, in step 51, the AFM layer 23 and pinned layer 24 are sequentially deposited on the seed layer 22 in a sputter chamber which may be the first sputter chamber in order to improve process efficiency.

Step 52 is an important feature of the present invention wherein an oxygen surfactant layer (OSL) 25 is formed on the pinned layer 24. In a preferred embodiment, the OSL 25 is formed in an oxidation chamber within the sputter deposition tool by treating the surface of the pinned layer 24 with oxygen plasma for a certain period of time. The oxygen plasma is generated under the following conditions: a RF power of 10 to 100 Watts; an $O_2$ flow rate of 0.01 to 10 standard cubic centimeters per minute (sccm); a pressure of $10^{-4}$ to 0.1 millitorr; and a temperature of 0° C. to 50° C. for a period of time that ranges from 10 to 300 seconds and preferably from 30 to 100 seconds.

During step 53, a metal layer that is preferably comprised of Al about 4 to 15 Angstroms thick and preferably about 5 Angstroms thick is deposited on the OSL 25 in a sputter deposition chamber at a temperature of 0° C. to 50° C. Optionally, a physical vapor deposition (PVD) method may be used to deposit the Al layer in the Anelva system. As stated previously, the OSL 25 serves to provide oxygen atoms to the Al film as the Al is being deposited and thereby forms a thin AlOx interface between the pinned layer 24 and the bulk of the deposited Al layer. In one aspect, a portion of the OSL 25 remains after step 53. Depending on Al deposition conditions, a majority of the oxygen atoms in the OSL 25 may react with Al to form a thin AlOx interface.

In step 54, the Al layer from step 53 is oxidized by a conventional method to form an AlOx tunnel barrier layer 26. The thin AlOx interface formed in step 53 functions as an oxygen diffusion barrier to prevent oxygen and/or oxygen radicals from reaching the pinned layer 24 during the oxidation process (step 54). Note that the tunnel barrier layer 26 is comprised of the thin AlOx interface resulting from oxidation of a portion of the Al film by the OSL and includes the AlOx layer formed in step 54 since the two AlOx layers are not distinguishable from one another. The AlOx tunnel barrier layer 26 formed on the OSL 25 was found to be more uniform than an AlOx layer formed directly on the pinned layer 24. Indeed, film uniformity for an AlOx tunnel barrier layer 26 has been measured to be about 2% (three sigma value) across a six inch substrate. Note that forming an AlOx tunnel barrier in step 54 may comprise transferring the wafer (after Al deposition on the OSL) to an oxidation chamber where a well known radical oxidation (ROX) process is performed and then returning to the sputter deposition chamber to deposit the free layer and cap layer on the AlOx layer. Alternatively, a natural oxidation (NOX) process as understood by those skilled in the art may be performed to convert the Al layer to AlOx.

Next, step 55 involves the sputter deposition of the free layer 27 on the tunnel barrier layer 26. Finally, in step 56, a cap layer 28 is sputter deposited on the free layer 27 to complete the TMR stack of layers. Following step 56, the TMR stack 29 may be annealed in a vacuum oven at 200° C. to 280° C. with a 10000 Oe applied magnetic field for about 5 hours to set the pinned layer and free layer magnetization directions. One advantage of the present invention is that the tunnel barrier layer 26, free layer 27, and cap layer 28 have a higher uniformity (smoothness) than previously achieved by the inventors. Thus, the interlayer coupling field (Hin) value is decreased. Note that the Hin value is related to film roughness and should be as small as possible. Furthermore, the inventors have discovered that the TMR element formed by the process flow in FIG. 6 is more reproducible since normal variations in oxidation time (step 54) are less likely to change the properties of the TMR element produced after step 57 is completed.

An experiment was conducted to demonstrate the improved performance achieved by implementing an OSL between a $CoFe_xB_y/CoFe_z$ pinned layer and a tunnel barrier layer in a TMR element as described in the first embodiment. Table 1 shows the results of a seed/AFM/AP2/Ru/$CoFe_xB_y$/$CoFe_z$/OSL/AlOx/free/cap TMR configuration wherein the OSL layer was formed by treating the $CoFe_z$ layer with oxygen plasma as in step 52 for varying times. The AlOx layer was formed by oxidizing a 5 Angstrom thick Al layer with a ROX process. In this study, the seed layer was a 50 Angstrom thick layer of NiCr, the AFM layer was a 150 Angstrom thick layer of MnPt, the outer pinned layer was a 20 Angstrom thick layer of CoFe, the Ru coupling layer was 7.5 Angstroms thick, the free layer was comprised of CoFe/NiFe with a thickness of 50 Angstroms, and the cap layer has a Ru configuration with a thickness of 20 Angstroms. The inner pinned layer was comprised of $CoFe_xB_y$ (10 Angstroms thick) and $CoFe_z$ (10 Angstroms thick) wherein x=8 atomic %, y=20 atomic %, and z=10 atomic %.

TABLE 1

Hin results for TMR element fabricated by process flow in FIG. 6

| | $O_2$ plasma time (sec.) in step 52 | | | | | |
|---|---|---|---|---|---|---|
| | 0 | 25 | 50 | 75 | 100 | 150 |
| Hin (Oe) | 55 | 50 | 34 | 33 | 32 | 32 |

The results in Table 1 show that Hin can be reduced by 20 Oe by applying an OSL on an inner pinned layer according to the present invention. Using the process conditions described previously, the OSL 25 appears to reach an equilibrium thickness after about 50 to 100 seconds of exposure to oxygen plasma based on the Hin values.

Returning to FIG. 6, the TMR stack is patterned in step 57 by following a conventional process sequence. For example, a photoresist layer (not shown) may be applied on the cap layer 28. After the photoresist layer is patterned, an ion beam etch (IBE) or the like is used to remove underlying layers in the TMR stack that are exposed by openings in the photoresist layer. The etch process stops on the bottom shield 21 to give a TMR element 29a with a top surface 29b and sidewalls 29c as shown in FIG. 4. Thereafter, an insulating layer 32 may be deposited along the sidewalls of the TMR element 29a. Once the photoresist layer is removed by a lift off process, the insulating layer 32 may be planarized by a chemical mechanical polish (CMP) to be coplanar with the top surface 29b of the TMR element. A top shield 30 is typically deposited on the insulating layer 32 and TMR element 29a followed by a second gap layer (not shown) on the top shield.

Other advantages of the present invention are found in Table 2 which shows RA, dR/R, and uniformity results from the same TMR configuration used to generate the Hin values in Table 1. RA values and dR/R were measured with a commercially available Capres system. A high dR/R ratio of over 20% is achieved with low RA (between 2 and 5 ohms-cm$^2$) and acceptable uniformity by forming an Al layer 5 or 5.25 Angstroms thick (prior to oxidation to AlOx) on an OSL according to an embodiment described herein. These results represent a higher performance than previously demonstrated by the inventors. Moreover, the AlOx tunnel barrier layer 26 may be made thinner than previously practiced because of a higher film uniformity that results from the insertion of an OSL 25 on the pinned layer 24. The OSL in samples 1 and 2 was fabricated using a 100 second oxygen plasma treatment in step 52.

TABLE 2

TMR results for TMR fabricated by the process flow in FIG. 6

| Sample | Al layer (Angstroms) | RA (Ohms-cm$^2$) | dR/R | Uniformity |
|---|---|---|---|---|
| 1 | 5.25 | 3.5 | 23.9% | 3% |
| 2 | 5 | 3 | 24.3% | 2% |

Figure 5:
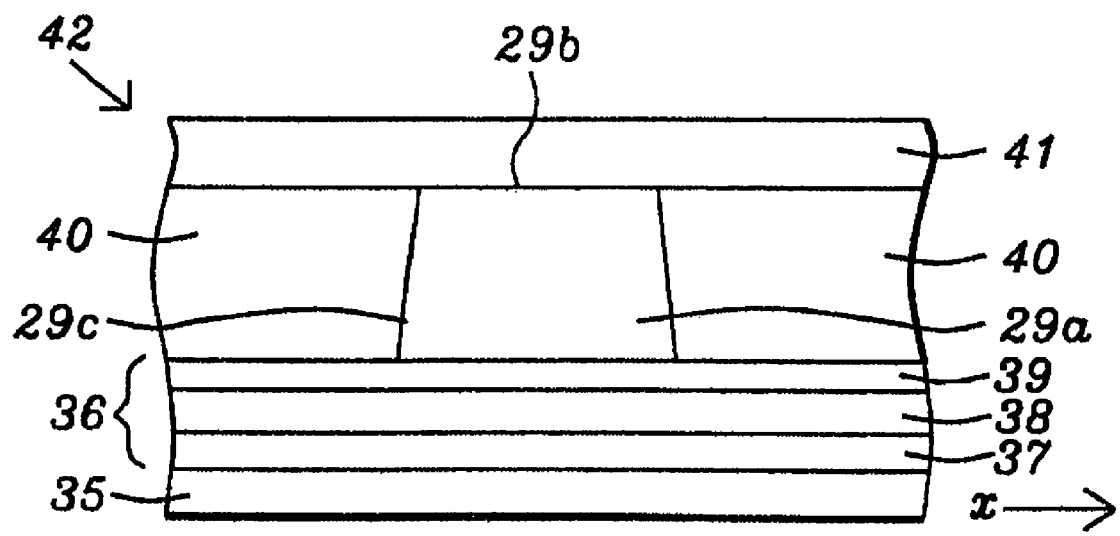
FIG. 5 is a cross-sectional view showing a TMR element that is part of an MRAM structure according to another embodiment of the present invention.

Referring to FIG. 5, a second embodiment of the present invention is shown wherein a TMR element 29d is formed between a bottom conductor 36 and a top conductor 41 in a MRAM structure 42. A substrate 35 is provided that typically comprises an isolation transistor (not shown) and an attached stud (not shown) that has a top surface which is coplanar with the top surface of the substrate. The stud is used to connect the isolation transistor to a bottom conductor 36. The bottom conductor 36 may have a seed layer/conductor/capping layer configuration. In one embodiment, the seed layer 37 is made of NiCr having a thickness of about 45 Angstroms and the conductor is comprised of a Ru film about 100 Angstroms thick. Alternatively, the seed layer may be comprised of Ta and the conductor 38 is made of Cu, Al, Au, or other conductive materials used in the art. The capping layer 39 may be one or more of Ta, Ru, Ti, Cr, or composites thereof such as a composite with an upper Ru layer and a lower Ta layer. The layers 37-39 are sequentially deposited by an ion beam deposition (IBD) method or the like in a sputter deposition system (tool). Conventional methods are used to pattern the bottom conductor 36.

Those skilled in the art will appreciate that a bottom conductor is disposed on the substrate below every location where a TMR (MTJ) element will subsequently be formed. The bottom conductor pattern (not shown) is typically comprised of a plurality of line segments having a length and width wherein the lengthwise direction is parallel to a first axis (x-axis). Note that each MRAM device has its own bottom conductor 36. For the purpose of this discussion, the bottom conductor 36 is a thin conductor line that is used to conduct current in a +x or −x direction.

It should be understood that the MRAM structure 42 is part of an MRAM array in which a plurality of MTJ elements 29d are formed between arrays of bottom conductors 36 and top conductors 41. In the exemplary embodiment, terminology relating to a 1T1MTJ will be used although the TMR (MTJ) element of the present invention could also apply to crosspoint MRAM architecture.

As described in Headway patent application HT03-022 which is herein incorporated by reference in its entirety, a Ta/Ru cap layer on a bottom conductor may be sputter etched to remove the Ru layer and a portion of the underlying Ta layer and thereby generate an amorphous Ta capping layer. In this embodiment, the process previously practiced by the inventors may be employed to form an amorphous Ta capping layer 39 that promotes smooth and flat layers within the TMR element 29d.

The same process flow shown in FIG. 6 that was used to fabricate TMR element 29a also applies to TMR element 29d. The TMR element 29d is similar to the previously described TMR element 29a except that the AlOx tunnel barrier layer 26 is preferably thicker in the second embodiment in order to adjust the RA for MRAM requirements. Nevertheless, the OSL layer 25 on the pinned layer 24 promotes a more uniform tunnel barrier layer 26 than would otherwise be achieved. In one aspect, the Al layer formed in step 53 (FIG. 6) may be 9 to 10 Angstroms thick. The resulting AlOx tunnel barrier layer 26 after step 54 is completed has a thickness of about 12 to 15 Angstroms and preferably 14 Angstroms for an MTJ bit size of 0.3×0.6 microns. Those skilled in the art will appreciate that a thinner Al layer about 8 to 9 Angstroms in thickness is required to form an AlOx layer about 11 to 12 Angstroms thick in order to reduce RA to an appropriate level for a bit size of 0.2×0.4 microns.

There is an insulation layer 40 formed adjacent to the TMR element 29d and on the bottom conductor 36 that is coplanar with the TMR element. The top conductor 41 may be comprised of Cu or another appropriate conductive material and is formed on the TMR element 29d and on the insulation layer 40. For a 1M1MTJ, the lengthwise direction of the top conductor (bit line) is aligned parallel to the lengthwise direction of the bottom conductor 44b. The TMR element 29d as viewed from a top-down perspective (not shown) may have an elliptical, eye, diamond, or rectangular shape to provide shape anisotropy as understood by those skilled in the art. The MRAM structure 42 is formed by a conventional method that will not be described herein.

The advantages of the second embodiment are the same as those realized in the first embodiment. In addition to forming a more uniform AlOx tunnel barrier layer, the dR/R ratio is improved, Hin and RA values are lowered, and a three sigma uniformity of about 2% across a six inch wafer is achieved for the tunnel barrier layer. Additionally, the free layer 27 and cap layer 28 are smoother than previously achieved. These results represent a higher MTJ performance than heretofore achieved by the inventors.

While this invention has been particularly shown and described with reference to, the preferred embodiment thereof, it will be understood by those skilled in the art that various changes in form and details may be made without departing from the spirit and scope of this invention.

We claim:
1. A high performance TMR element, comprising:
 (a) a pinned layer having a SyAP configuration represented by AP2/coupling/AP1 in which AP2 is the outer portion of the pinned layer formed on a substrate and AP1 is formed on a coupling layer and is the inner portion of the pinned layer, said inner portion is a composite CoFe$_x$B$_y$/CoFe$_z$ layer wherein x and y represent the atomic % of Fe and B, respectively, in a lower CoFe$_x$B$_y$ layer and z is the atomic % of Fe in an upper CoFe$_z$ layer;
 (b) an oxygen surfactant layer (OSL) formed on said inner portion; and
 (c) a tunnel barrier layer formed on the oxygen surfactant layer.
2. The high performance TMR element of claim 1 wherein the substrate is a stack of layers comprised of a bottom shield in a read head or a bottom conductor in a MRAM structure, a seed layer on the bottom shield or bottom conductor, and an

AFM layer on the seed layer, said seed layer represents the bottom layer of the TMR element.

3. The high performance TMR element of claim 1 wherein the lower $CoFe_xB_Y$ layer has a composition wherein x is from 0 to about 70 atomic % and y is from 0 to about 30 atomic %, and the upper $CoFe_Z$ layer has a composition wherein z is from 0 to 100 atomic %.

4. The high performance TMR element of claim 1 wherein the lower $CoFe_xB_Y$ layer has a thickness from 0 to about 100 Angstroms, the upper $CoFe_Z$ layer has a thickness from 0 to about 100 Angstroms, and the total thickness of the composite $CoFe_xB_Y/CoFe_Z$ layer is between about 10 and 100 Angstroms.

5. The high performance TMR element of claim 2 wherein the AP2 portion is comprised of CoFe with a thickness of about 10 to 100 Angstroms and the coupling layer is made of Ru with a thickness of from 3 to 9 Angstroms.

6. The high performance TMR element of claim 1 wherein the OSL is less than about one atomic layer thick.

7. The high performance TMR element of claim 1 wherein the tunnel barrier layer is comprised of AlOx having a film thickness (three sigma) uniformity of about 2% to 3% across a six inch substrate.

8. The high performance TMR element of claim 5 further comprised of a free layer formed on the tunnel barrier layer and a cap layer on the free layer to form a seed/AFM/AP2/Ru/AP1/OSL/tunnel barrier/free/cap configuration.

9. The high performance TMR element of claim 8 wherein the seed layer is a 50 Angstrom thick layer of NiCr, the AFM layer is a 150 Angstrom thick layer of MnPt, the free layer is comprised of CoFe/NiFe with a thickness from about 10 to 100 Angstroms and the cap layer is comprised of Ru with a thickness between about 10 and 200 Angstroms.

10. The high performance TMR element of claim 9 wherein the seed/AFM/AP2/Ru/AP1/OSL/tunnel barrier/free/cap configuration has a dR/R of greater than 23%, a RA value of about 3 ohm-cm$^2$, and a Hin value of about 32 Oe.

11. A high performance TMR element, comprising:
(a) a seed layer formed on a substrate and an AFM layer on the seed layer;
(b) a pinned layer formed on the AFM layer wherein the pinned layer is comprised of a composite $CoFe_xB_Y/CoFe_Z$ layer in which x and y represent the atomic % of Fe and B, respectively, in the lower $CoFe_xB_Y$ layer and z is the atomic % of Fe in the upper $CoFe_Z$ layer;
(c) an oxygen surfactant layer (OSL) formed on said $CoFe_Z$ layer in the composite $CoFe_xB_Y/CoFe_Z$ layer;
(d) a tunnel barrier layer formed on the oxygen surfactant layer;
(e) a free layer on the tunnel barrier layer; and
(f) a cap layer on the free layer.

12. The high performance TMR element of claim 11 wherein the substrate is a bottom shield in a read head.

13. The high performance TMR element of claim 11 wherein the lower $CoFe_xB_Y$ layer has a composition in which x is from 0 to about 70 atomic % and y is from 0 to about 30 atomic %, and the upper $CoFe_Z$ layer has a composition wherein z is from 0 to 100 atomic %.

14. The high performance TMR element of claim 11 wherein the lower $CoFe_xB_Y$ layer has a thickness from 0 to about 100 Angstroms, the upper $CoFe_Z$ layer has a thickness from 0 to about 100 Angstroms, and the total thickness of the composite $CoFe_xB_Y/CoFe_Z$ layer is between about 10 and 100 Angstroms.

15. The high performance TMR element of claim 11 wherein the composite $CoFe_xB_Y/CoFe_Z$ layer represents an inner pinned layer and the pinned layer is further comprised of an outer pinned layer formed on the AFM layer and a coupling layer between the outer and inner pinned layers.

16. The high performance TMR element of claim 15 wherein the outer pinned layer is comprised of CoFe and has a thickness between about 10 and 100 Angstroms and the coupling layer is made of Ru with a thickness of 3 to 9 Angstroms.

17. The high performance TMR element of claim 11 wherein the OSL is less than about one atomic layer thick.

18. The high performance TMR element of claim 11 wherein the tunnel barrier layer is comprised of AlOx having a film thickness (three sigma) uniformity of about 2% to 3% across a six inch substrate.

19. The high performance TMR element of claim 11 wherein the seed layer is a 50 Angstrom thick layer of NiCr, the AFM layer is a 150 Angstrom thick layer of MnPt, the free layer is comprised of CoFe/NiFe with a thickness from about 10 to 100 Angstroms and the cap layer is comprised of Ru with a thickness between about 10 and 200 Angstroms.

* * * * *